(12) United States Patent
Erickson et al.

(10) Patent No.: US 6,287,880 B1
(45) Date of Patent: Sep. 11, 2001

(54) METHOD AND APPARATUS FOR HIGH RESOLUTION PROFILING IN SEMICONDUCTOR STRUCTURES

(75) Inventors: Andrew Norman Erickson; Peter De Wolf, both of Santa Barbara, CA (US)

(73) Assignee: Veeco Instruments Inc., Plainview, NY (US)

( * ) Notice: Subject to any disclaimer, the term of this patent is extended or adjusted under 35 U.S.C. 154(b) by 0 days.

(21) Appl. No.: 09/751,728

(22) Filed: Dec. 29, 2000

(51) Int. Cl.$^7$ .................................................. G01R 31/26
(52) U.S. Cl. ............................ 438/17; 438/18; 438/514; 73/105
(58) Field of Search ........................ 73/105, 159, 304 C; 324/715, 501, 508; 438/17, 18, 514

(56) References Cited

U.S. PATENT DOCUMENTS

| | | | |
|---|---|---|---|
| 5,325,021 | * 6/1994 | Duckworth | 250/181 |
| 5,585,734 | 12/1996 | Meuris et al. | |
| 5,691,812 | * 11/1997 | Bates | 356/243 |
| 6,069,017 | * 5/2000 | Kamieniecki | 438/17 |
| 6,110,823 | * 8/2000 | Eldridge | 438/14 |

\* cited by examiner

*Primary Examiner*—John F. Niebling
*Assistant Examiner*—Andre' C Stevenson
(74) *Attorney, Agent, or Firm*—Nilles & Nilles, S.C.

(57) ABSTRACT

A method for determining the characteristics of a doped semiconductor substrate is disclosed, wherein a scanning probe microscope, preferably an atomic force microscope, is used to move a probe across a sample surface gathering electrical measurements at many locations. The probe tip is conductive and is connected to a control circuit that applies a voltage to the probe and to an electrode fixed to the semiconductor substrate. Preferably, the current that flows through the sample is measured and saved, together with the position of the probe on the surface of the sample. In this manner, the characteristics of the doped sample can be determined at many different locations with many different degrees of doping. The sample is prepared by doping its top surface, then machining off the top surface to provide access to the sample at different doping depths. By driving the probe back and forth across the surface and taking readings of the sample at many different locations, a map of the electrical, characteristics at various doping depths below the top surface can be developed. By using a single scanning probe, that probe can be manufactured to have an extremely small radius of curvature, and hence a much smaller contact spot on the surface of the sample.

29 Claims, 6 Drawing Sheets

METHOD AND APPARATUS FOR HIGH RESOLUTION PROFILING IN SEMICONDUCTOR STRUCTURES

BACKGROUND OF THE INVENTION

Semiconductors are fabricated by taking a basic semiconductor substrate and doping the surface of that substrate with impurities. In some cases, the materials are implanted directly upon the surface of the substrate. In other cases, the impurities are previously incorporated into the substrate itself.

One technique of implanting a second material into a substrate is that of ion beam implantation. In this technique, an ion beam is directed to the surface of the substrate, and the ions, traveling at high velocity, penetrate to a certain, predetermined depth in the substrate itself before stopping. By implanting these impurity ions, and through subsequent thermal treatment, the conductivity of the semiconducting material is increased. These changes permit the formation of integrated circuits in which electrons can be conducted in closely spaced paths throughout the substrate.

As integrated circuit technology develops, the width and depth of these implanted regions decreases. By reducing the size of the implanted regions, gates and traces on the substrate can be spaced closer and closer together. Just a few years ago, the depth of ion implantation was typically on the order of 0.5 to 1 microns. In recent years, the implanted regions have been reduced in depth to below 0.1 microns.

As these shallow implants are developed, it is necessary to determine the depth profile of the implanted regions. In particular, the depth, width, and concentration of ions implanted need to be carefully monitored. Only by providing experimenters with this research data can they further improve their processes.

A traditional technique for determining the characteristics of an implanted region is Spreading Resistance Profiling, or SRP. An apparatus 1 for performing SRP is shown in FIG. 1A. In this technique, a small sample 2 having an implanted region 3 is prepared by making an angular cut in a surface 4 of the doped region 3 to create a beveled region or surface 5, and mounting the prepared substrate in a sample holder (not shown). SRP machine 1 includes two probes 6, 7 spaced closely together that are moved generally simultaneously across the angular beveled region of prepared sample 2 to obtain data at various locations of the sample. As probes 6, 7 are moved across the surface to several different locations, they are pressed down firmly against the surface of the substrate in order to make good electrical contact with the substrate. SRP probes are typically on the order of 1–5 microns in radius at the point or points they contact the substrate.

With probes 6, 7 making electrical contact with the sample, a voltage is applied across these electrodes, and the amount of current flow through the electrodes is measured. Knowing both the current and voltage, the resistivity of the sample as a function of depth can be determined. The relationship of resistivity to ion concentration is well known to those skilled in the art. Therefore from a plot of resistivity data versus depth, the implant characteristic or doping concentration can be measured and results delivered to process engineers. Notably, due to the size of electrodes 6, 7, however, they are spaced relatively far apart.

In order to make good contact with the surface of the prepared sample, the pressure applied to the surface by the SRP probe is substantial. The compression or indent of atoms that results from pressure applied to the SRP probe causes the electrical characteristics of the sample in that region to change. In addition, the two probes are spring or pneumatically actuated and move, ideally, simultaneously toward and away from the surface of the prepared sample. Due to mechanical limitations of the SRP machine, including the lack of a controlled force on each probe, indent depth is often inconsistent. Since the bevel is created to extend the depth dimension laterally, preferably at a shallow angle to facilitate making measurements at highly precise depths, any increase or other inconsistency in indent depth between the probes (also arranged laterally) defeats the precision of the measurement created at least in part by the shallow bevel.

In order for the resistance data to be usable the probes must have a constant spacing throughout the measurement. Alignment between probes is critical and a line connecting the probe tips must be perpendicular to the bevel direction or the sampled material from the two probes will be at different depths.

Another drawback is that the probes may wear differently. If one probe tip is worn down and the other probe tip is not, the electrical resistance between one probe tip and the surface of the substrate will be much greater than the resistance between the other probe tip and the substrate. In addition, the difference in contact area between the two probes will cause different amounts of deformation of the substrate where each probe contacts the surface. The differing deformation will change the electrical characteristics of the doped substrate and cause the SRP to produce erroneous readings. All of these characteristics of SRP cause bad test results.

In another technique, shown in FIG. 1B, a scanning proximity microscope 8 is used to control the force on the probe or probes 9 so that the above limitations are reduced. The proximity microscope provides force control for the contact on the sample 10, and thereby eliminates some of the errors associated with unequal contacts and varying contact depths. The forces may be small, thus allowing use of a smaller tip 11, typically 5–500 nanometers in radius. However, with current proximity microscope technology it remains difficult to use two probe contacts. The current state of the art uses a "back" contact somewhere on the sample which may induce errors due to series resistance and current flow through nearby heavily doped or metallic regions.

What is needed, therefore, is an improved method and apparatus for determining the electrical characteristics of a doped semiconductor. It is an object of this invention to provide such a method and apparatus.

SUMMARY OF THE INVENTION

The first embodiment of the invention is directed to a method of determining the electrical characteristics of a doped semiconductor substrate, machining the top surface away to provide a beveled surface that is disposed at an angle with respect to the top surface, wherein the beveled surface exposes a plurality of dopant densities at a plurality of depths within the substrate, fixing an electrode at a first electrode location to the substrate, perpendicular to the bevel plane, moving an electrically conductive probe to a first probe location on the beveled surface, applying a first electrical potential across the probe and electrode wherein the first electrical potential is sufficient to generate a first current through a first current carrying path defined between the first electrode location and the first probe location, wherein the first electrical potential and the first current collectively define a first electrical characteristic of the substrate along the first current carrying path and recording a first value indicative of the first electrical characteristic.

According to another aspect of the invention, the method includes moving the probe to a second probe location on the beveled surface, applying a second electrical potential across the probe and electrode wherein the second electrical potential is sufficient to generate a second current through a second current carrying path defined between the first electrode location and the second probe location, wherein the second electrical potential and the second current collectively define a second electrical characteristic of the substrate along the first current carrying path, and recording a second value indicative of the second electrical characteristic.

The first and second electrical potentials may be the same, and the first and second currents different. In this case, the first and second values saved will be indicative of the first and second currents, respectively.

The first and second currents may be the same, and the first and second electrical potentials different. In this case, first and second values saved will be indicative of the first and second electrical potentials, respectively.

The probe may be an atomic force microscope probe, and the method may include the steps of determining a first height value indicative of the height of the first location based upon the mechanical interaction of the probe with the beveled surface at the first location, and determining a second height value indicative of the height of the second location based upon the mechanical interaction of the probe with the beveled surface at the second location.

The upper portion of the beveled surface that adjoins an unmachined portion of the top surface may be rounded, and the first and second probe locations on the beveled surface may be located in the rounded upper portion.

A second embodiment of the invention is directed to a method of determining the electrical characteristics of a doped semiconductor substrate using an atomic force microscope, the microscope having a piezoelectric actuator configured to selectively move a single conductive probe tip across the surface of a sample by either moving the probe with respect to the sample or by moving the sample with respect to the probe, wherein the probe tip is disposed on a free end of a cantilevered beam. The microscope is configured to generate a signal indicative of the height of the sample. The method comprises the steps of doping a top surface of a semiconductor substrate with a first dopant material, machining the top surface away to provide a beveled surface that is disposed at an angle with respect to the top surface, wherein the beveled surface exposes a plurality of dopant densities at a plurality of depths within the substrate, fixing an electrode at a first electrode location to the substrate, fixing the substrate to the sample holder of the microscope, applying a first voltage to the piezoelectric actuator to move the probe tip and beveled surface with respect to each other until the probe tip contacts the beveled surface at a first probe location.

The method preferably further includes applying a first electrical potential across the probe tip and electrode wherein the first electrical potential is sufficient to generate a first current through a first current carrying path defined between the first electrode location and the first probe location, wherein the first electrical potential and the first current collectively define a first electrical characteristic of the substrate along the first current carrying path. The method further includes the steps of recording a first value indicative of the first electrical characteristic.

According to another aspect of the invention, the method includes the additional steps of applying a second voltage to the piezoelectric actuator to move the probe tip and beveled surface with respect to each other until the probe tip contacts the beveled surface at a second probe location, applying a second electrical potential across the probe and electrode wherein the second electrical potential is sufficient to generate a second current through a second current carrying path defined between the first electrode location and the second probe location, wherein the second electrical potential and the second current collectively define a second electrical characteristic of the substrate along the first current carrying path, and recording a second value indicative of the second electrical characteristic.

The first and second electrical potentials may be the same, and first and second currents different. In which case the first and second values saved will be indicative of the first and second currents, respectively.

The first and second currents may be the same, and first and second electrical potentials different. In which case the first and second values saved will be indicative of the first and second electrical potentials, respectively.

The probe may be an atomic force microscope probe, and the steps of determining a first height value indicative of the height of the first location based upon the mechanical interaction of the probe tip with the beveled surface at the first location, and determining a second height value indicative of the height of the second location based upon the mechanical interaction of the probe tip with the beveled surface at the second location.

An upper portion of the beveled surface may adjoin an unmachined portion of the top surface that is rounded, and the first and second probe locations on the beveled surface may be in the rounded upper portion.

The step of doping the semiconductor substrate may include the step of doping the semiconductor substrate to a depth of no greater than 100 nanometers.

The step of doping the semiconductor substrate may include the step of doping the semiconductor substrate to a depth of no greater than 50 nanometers.

The step of doping the semiconductor substrate may include the step of doping the substrate to a depth of no greater that 30 nanometers.

The probe tip may have a radius of no more than 100 nanometers, no more than 50 nanometers, or no more than 30 nanometers.

The steps of applying the first and second electrical potentials may include the step of applying a probe tip force of no more than a millionth of a Newton against the beveled surface.

The contact area between the probe tip and the beveled surface at the first and second locations may be no greater than thirty square nanometers, no greater than twenty square nanometers, or no greater than ten square nanometers.

The method may include the step of fixing an electrode which includes the step of coating a free side of the sample with a conductive metal.

The conductive metal may comprise at least one of the group consisting of aluminum, copper, silver, gold, and tungsten.

The step of fixing an electrode may include the steps of machining a trench in the surface of the sample and filling the trench with a conductive metal.

The step of fixing an electrode may include the step of implanting a portion of the silicon substrate with a high density conductive material, thereby creating the electrode.

BRIEF DESCRIPTION OF THE DRAWINGS

Like reference numerals in the FIGURES denote like components.

DETAILED DESCRIPTION OF THE PREFERRED EMBODIMENTS

Figure 2A:
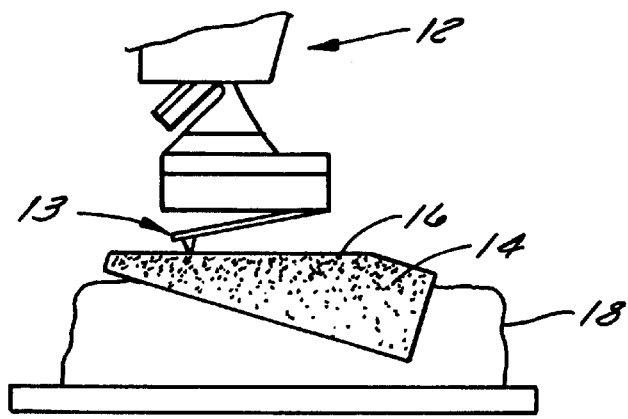
FIG. 2A shows an atomic force microscope probe in contact with a doped sample beveled at an angle according to the present invention.

FIG. 2A shows a piezoelectric actuator 12 for an atomic force microscope to which a probe 13 is attached. Probe 13 is in contact with a sample 14 that has been doped such that it has a high concentration of dopant atoms on its upper surface and a increasingly lower concentration of dopant atoms descending through the sample. This is shown by the decreasing density of the speckled markings of FIG. 2A which are indicative of the decreasing density of dopant atoms.

Sample 14 has a beveled surface 16 that has been machined away (preferably after the sample is doped), and is mounted so as to provide a free surface that faces probe 13. At various locations along the bevel, this surface 16 has different concentrations of dopant atoms.

Sample 14 is held on a sample base 18 which is fixed with respect to the microscope frame (not shown). Actuator 12 is deflected laterally as well as up and down to control the position of probe 13 with respect to beveled surface 16. By changing the signal applied to actuator 12, probe 13 can be moved in three orthogonal directions: upward and downward, in and out (with respect to the surface of the paper) and leftward and rightward. This permits the operator to position probe 13 against beveled surface 16 at a plurality of locations. One method of moving the probe with respect to the sample is described in greater detail in U.S. Pat. Nos. 6,008,489 and 6,038,916. Using the present system, the position of probe 13 with respect to beveled surface 16 can be precisely controlled. At any point of contact on the surface, the height and lateral position of the probe can be determined and saved for future use, e.g., for analyzing dopant concentrations at various points on the sample.

Figure 2B:
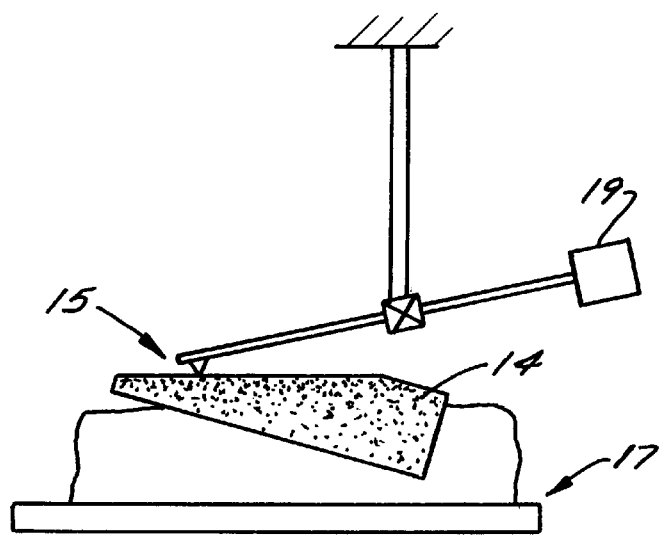
FIG. 2B shows a scanning proximity microscope with a doped sample beveled at an angle according to the present invention.

FIG. 2B shows an additional embodiment using a proximity microscope in which a profiler stage 17 is used in conjunction with the present invention. In this embodiment, stage 17 is moved in a single plane relative to probe 15. The probe force is controlled via a counterbalance 19, as is well known in the art. Similarly, the probe may be moved and the stage fixed.

Figure 3A:
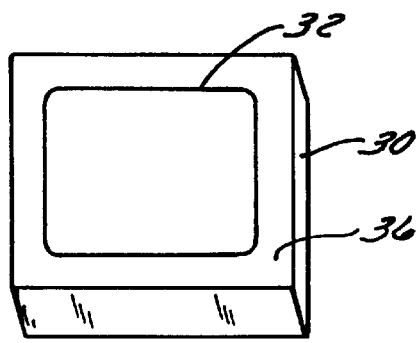
FIG. 3A is a perspective view of an initial step in preparing a sample such as that shown in FIGS. 2A and 2B, after the substrate is doped and before it is beveled.
Figure 3B:
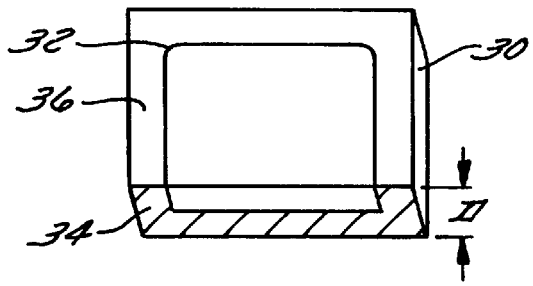
FIG. 3B is a perspective view of the sample in FIG. 3A after facing and before beveling.
Figure 3C:
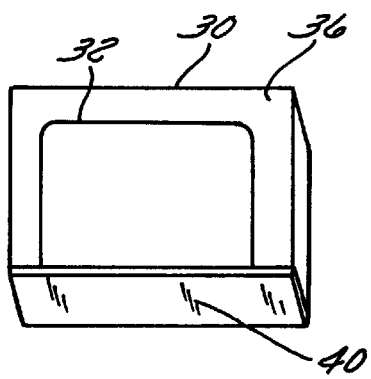
FIG. 3C is a perspective view of the sample in FIG. 3B after an electrode has been added but before beveling.

FIGS. 3A–3D show the preparation of a sample 20 for profiling in accordance with a preferred embodiment of the invention. FIG. 3A shows a semiconductor substrate 30 (e.g., silicon) that has been implanted with ions 32, i.e., doped N or P type. Preferably, ion implant 32 is disposed on a top surface 36 of substrate 30. After the step of implantation, substrate 30 is machined to expose a face or surface 34, as shown in FIG. 3B, which is adapted to receive an electrode. After surface 36 has been prepared and implanted with ions to a depth D, surface 34 is exposed, and an electrode 40 is disposed on surface 34 of substrate 30 as shown in FIG. 3C. Electrode 40 extends along the length of the substrate 30 in the region where substrate 30 will be beveled.

Figure 3D:
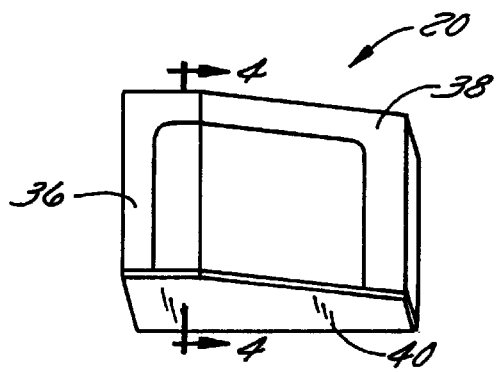
FIG. 3D is a perspective view of a doped and beveled sample having an electrode.
Figure 4:
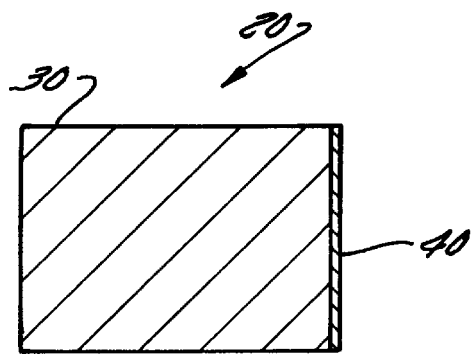
FIG. 4 is a cross-sectional view of the sample of FIG. 3D taken along lines 4—4, showing the doped sample and the deposited, plated or painted conductive electrode on one side of the sample.

In the preferred embodiment, as seen in FIG. 3D, a beveled surface 38 is then machined on top surface 36 of substrate 30 to define beveled surface 38 which is disposed at an angle of between 0.001 to 45 degrees of top surface 36 on which the ion implant was placed. This micro-machining process is preferably performed by grinding away surface 36 of the sample. The prepared sample resulting from this process is shown in FIGS. 3D and 4. Notably, electrode 40 spans the entire length and thickness of one face of sample 20.

According to one method of the invention, electrode 40 is formed by coating sidewall 34 of sample 20 with a material having a conductivity greater than that of the adjacent implanted region of the sample. Preferably, this coating will have a conductivity at least five times that of the most conductive portion of the implanted region.

Figure 5:
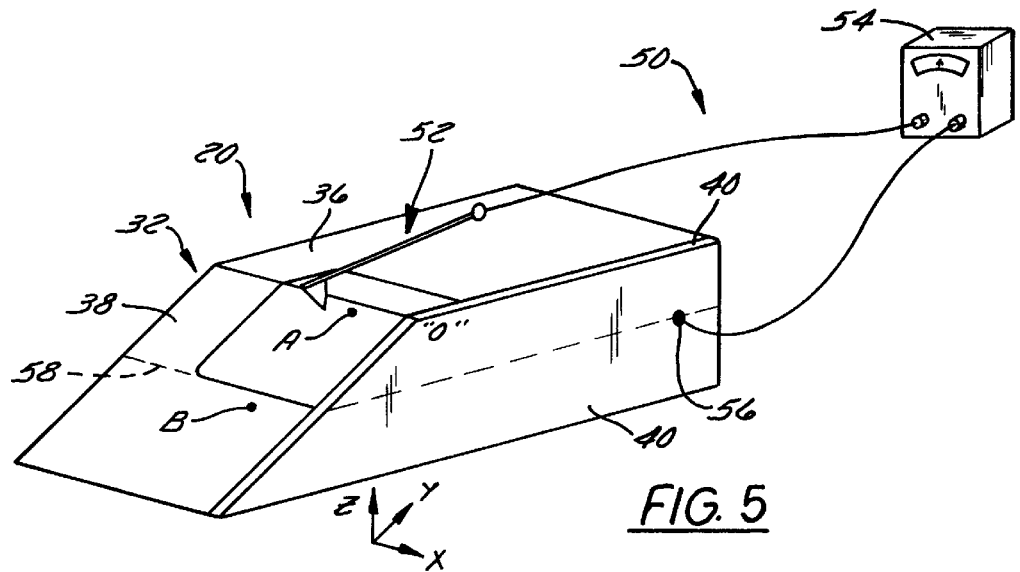
FIG. 5 shows the sample of FIG. 3D in conjunction with the single probe measuring apparatus of the present invention.

Turning to FIG. 5, an apparatus 50 for measuring electrical characteristics of the sample 20 is shown. Apparatus 50 includes a single probe 52 that moves across beveled surface 38 of sample 20 and is electrically coupled to a voltage-applying/current-measuring circuit 54. Circuit 54 is further coupled to electrode 40 at connection 56. Preferably, this connection is fixed. Thus, only a single probe 52 is needed to scan the sample 20 and to obtain data. In operation, the electrical characteristics (e.g., resistance) are measured at a plurality of locations on sample 20 by moving a single electrode to different locations while the other electrode is fixed in constant contact with the sample.

Dashed line 58 in FIG. 5, which extends laterally across beveled surface 38 at substantially the same depth below surface 36 of sample 20 along its length, indicates the lower boundary of the ion implanted region 32 of sample 20. To measure the ion implantation density near this boundary, the tip of probe 52 is translated until it is proximate to a point B on beveled surface 36, for example. To measure the ion implantation density near the upper surface of the sample where the ion density is greatest, the probe tip would be moved until proximate point A, for example, on beveled surface 36.

Since the ions are implanted in a substantially homogeneous manner to surface 36 of sample 20, the depth of penetration, and hence the lower boundary of the ion implantation region will be substantially the same across the width of the sample, no matter what angle the bevel is made. Thus, the determination of the ion implantation density at point A is indicative of the ion implantation density throughout the sample (whether machined or not) at the same depth of point A prior to the bevel being machined into the sample surface. The same is true of point B.

As a result, a researcher can determine the ion density at various depths in sample 20 by measuring electrical characteristics of the prepared sample along the beveled surface 38. By moving probe 52 with respect to sample 20 either leftward or rightward along the beveled surface 38 (i.e., in the x-direction, as shown in FIG. 5), or up or down beveled surface 38 (i.e., in the y and z directions, as shown in FIG. 5), a variety of measurements are made which are indicative of electrical characteristics of sample 20 at various implantation depths.

In the embodiment of FIG. 5, electrode 40 extends substantially perpendicularly to the base of prepared sample 20, while sample 20 is preferably mounted as shown in FIG. 2A. As a result, the y coordinate of the position of probe 52 is indicative of the depth at which the doping is measured. To determine the electrical characteristics of sample 20 at a particular depth, probe 52 is moved with respect to sample 20 (or the sample is moved with respect to the probe) until probe 52 is above the point at which the measurement is to be made. At this point, probe 52 is lowered into contact with beveled surface 38. An electrical potential is applied to electrode 40 that extends along the edge of the prepared sample, and is also applied to the probe. This creates a potential difference between the point of contact of the tip of probe 52 on surface 38 and electrode 40.

Once system 50 determines that probe 52 is in contact with surface 38, the electrical characteristics of sample 20 are determined in one of two ways. First, a predetermined electrical potential difference can be applied across electrode 40 and the probe 52. The current flowing through the circuit made by probe 52, prepared sample 20, electrode 40 and control circuit 54 is measured and saved by control circuit 54. Alternatively, a predetermined current can be driven through electrode 40, sample 20 and probe 52 and the resulting electrical potential between probe 52 and electrode 40 is saved.

Using either of these methods, the system determines the conductivity of sample 20 between the point of contact of probe 52 on surface 38 of sample 20 and the surface of the sample to which electrode 40 is attached.

Figure 6A:
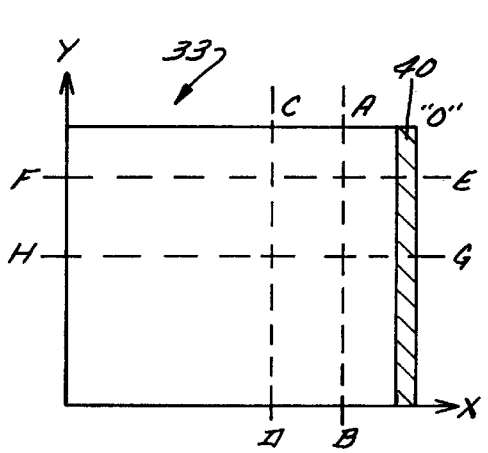
FIG. 6A shows the image area illustrated in FIG. 5, including data collection slices extending about the image area.

Turning to FIG. 6A, an image area 33 of doped region 32 of sample 20 shown in FIG. 5 is plotted on an x-y coordinate system corresponding to the plane of beveled surface 38. Notably, electrode 40 is shown adjacent to image area 33 and defines a zero point at its upper right hand corner (also shown on FIG. 5). Using the apparatus of FIG. 5 to measure resistance, a plurality of data points are obtained along the slices shown in FIG. 6A. In particular, the resistance is measured along longitudinal slices A–B and C–D, and lateral slices E–F and G–H. The longitudinal data collection slices are displaced from electrode 40 a particular distance along their entire lengths and, because they are parallel, are disposed a particular distance from each other along their lengths. Similarly, the individual lateral data collection slices E–F and G–H are parallel and the corresponding resistance data should be indicative of generally equal dopant levels along their respective lengths. The dopant profile data collected along these slices is plotted in FIG. 6B. Alternately resistance data may be acquired over the entire bevel face 38 or over portions thereof by scanning the probe while it is in contact with the face at a predetermined force. Image or point-by-point data may also be collected at a variety of forces, voltages, or currents. From the image(s) a set of data slices may be collected at various positions, forces, etc.

Figure 6B:
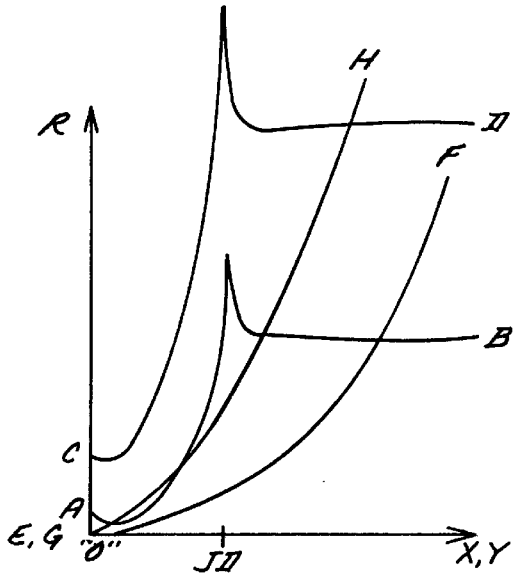
FIG. 6B shows a series of line plots generated using the image data obtained at the locations corresponding to the slices shown in FIG. 6A.

More specifically, turning first to longitudinal slice A–B, note that slice A–B defines a constant position in x, while the y position changes along the slice. As shown in FIG. 6B, the resistance measured near the top of the sample 20, which includes a comparatively high concentration of dopant material, is low. As measurements are made moving from point A to point B along the slice, the resistance increases as doping concentration decreases, as expected. In moving along the slice from points A to B, there is an initial dip in the measured resistance illustrating that when the substrate 30 is implanted, the highest concentration of dopant typically is slightly below the surface 36 of sample 20 due to the fact that the energy of the ions being implanted into substrate 30 causes the highest concentration of dopant to be slightly displaced from the top surface of sample 20. Continuing along the A–B plot in FIG. 6B, resistance increases and then "spikes" at a point corresponding to what is commonly known in the semiconductor field as the junction depth, labeled "JD." The junction depth defines a region where there are generally no carriers, and thus the resistance is very high. After passing through the junction depth, the dopant profile settles to a generally constant level as measurements are made at deeper locations moving along the slice towards point B.

Similarly, the dopant profile along slice C–D, which is displaced a particular distance from electrode 40, a distance further than the distance of slice A–B from electrode 40, has a similar shape to the profile along slice A–B. Notably, however, because C–D is further from electrode 40, the resistance measured along slice C–D is greater at each corresponding point moving towards point D. Again, the spike illustrated in FIG. 6B along the C–D plot is indicative of junction depth, as described above.

Turning to lateral slices E–F and G–H, each of which corresponds to a dopant level taken at an associated depth, the resistance measured along these slices increases as the measurements are made at greater distances from electrode 40, again as expected. Most notably, the increase in resistance is primarily due to the increase in distance from electrode 40 at which the measurement is made, and not due to differing dopant levels. However, the difference between the data associated with slices E–F and G–H, when compared at corresponding depths in the sample along the curves in FIG. 6B, is indicative of a difference in the amount of dopant material at the corresponding locations. Again, the x position varies along each individual curve corresponding to lateral data collection slices E–F and G–H, while the y position remains constant, generally corresponding to a particular doping depth. Notably, the results shown in FIG. 6B generally correspond to the data obtained using conventional SRP methods except that data is acquired with one probe and the data variation along x corresponds to different effective dual probe spacings.

Figure 1A:
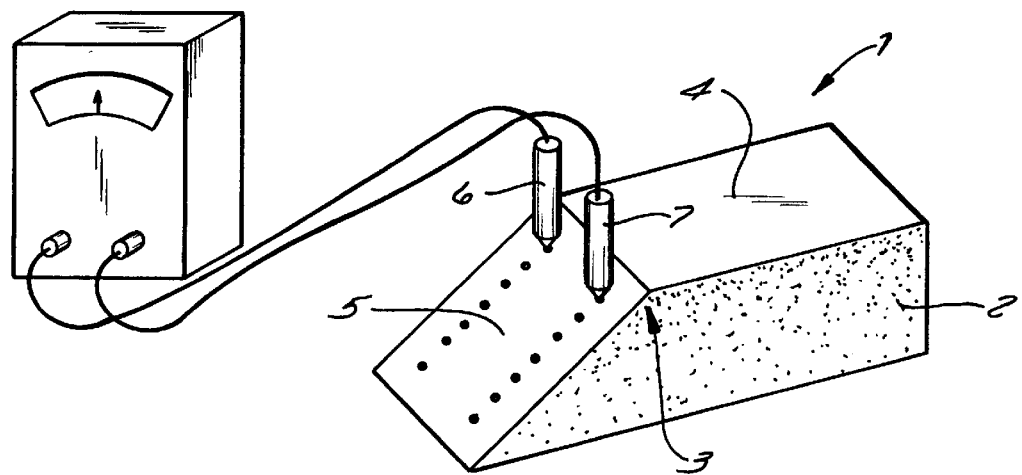
FIG. 1A illustrates a dual probe spreading resistance profiling apparatus of the prior art.
Figure 1B:
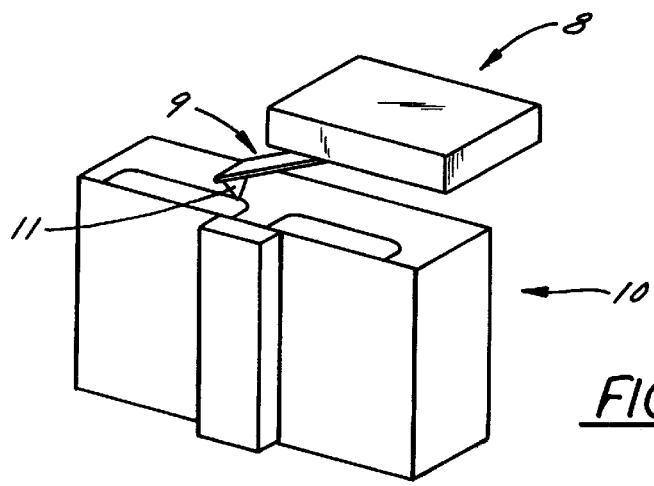
FIG. 1B illustrates a prior art single probe scanning proximity microscope for resistance profiling.
Figure 7:
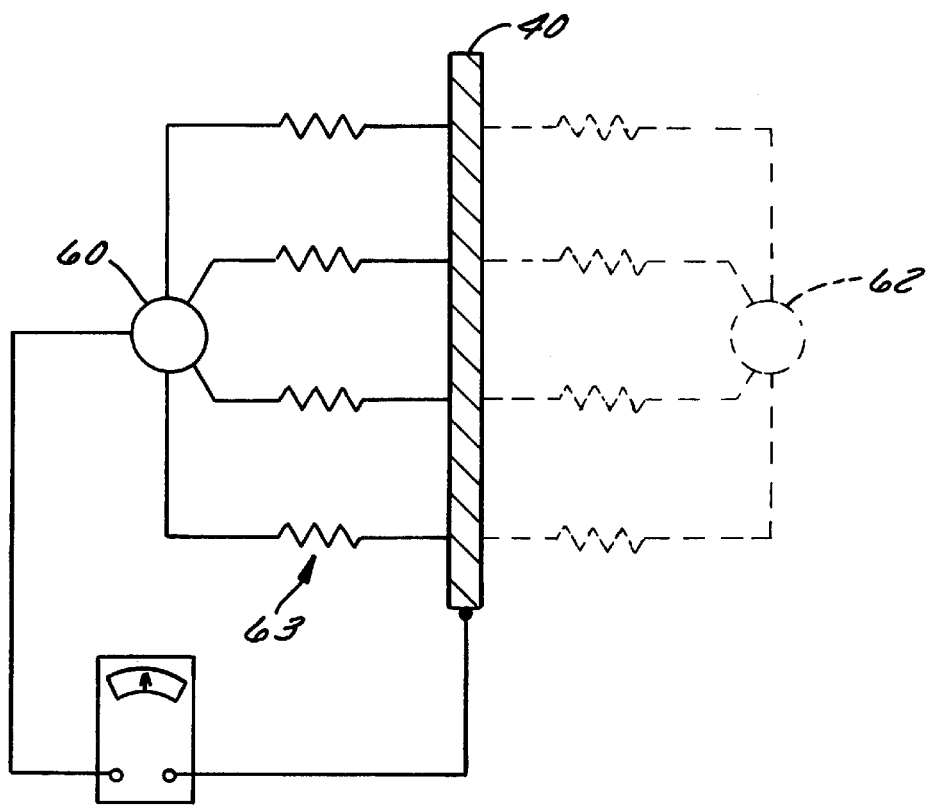
FIG. 7 is a schematic of the resistance path from the probe to the electrode with a corresponding image probe, shown in phantom, illustrating how the preferred embodiment effectively operates as an ideal two probe system.

It is important to know the electrical characteristics of the sample at a variety of depths in order to determine the effects of the ion implantation. The ultimate goal is to determine the depthwise profile of the ion implantation. To do this, the location of probe 52 where each measurement is taken is saved together with the conductance/resistance measurement itself. Consequently, whenever an electrical measurement is made of the current flowing between probe 52 and electrode 40, the x-y, and possibly z, coordinates of the point where probe 52 contacts beveled surface 38 are recorded. Notably, in comparison to "two probe" dopant profiling systems, such as that shown in FIG. 1A, the position of the lateral electrode 40 in the present invention creates a current collection plane, as illustrated in FIG. 7, mirroring the collection from a single identical contact point 62 twice the distance from a first point 60. The resistance (represented by 63 in FIG. 7) of the point and plane geometry will be one half of the two point case (utilizing two probes, as in the previously described systems), thus making it possible for the single point probe contact of the preferred embodiment to determine the parameters of the measurement. In this way the errors observed in prior art systems due to probe non-uniformity, and non-ideal electrode position are eliminated. The effective probe spacing can be made arbitrarily small or large by placing the probe close to the plane electrode. Additionally, alignment is not an issue since the collection electrode is uniform in depth. As a result, with the preferred embodiment, the effect of placing two probes together with the same contact area, resistance, force, and in perfect alignment can be satisfied.

Figure 8:
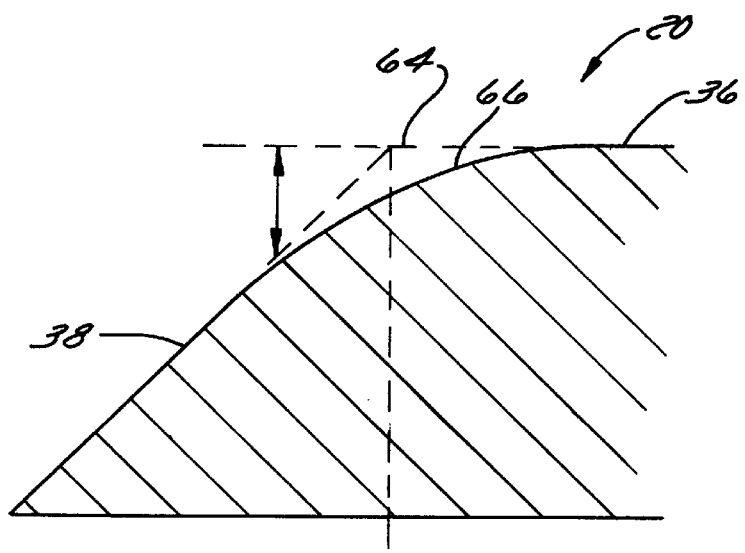
FIG. 8 is a cross-section of the beveled sample showing the rounding (exaggerated) at the top of the bevel produced during machining of the sample.

Referring now to FIG. 8, an illustration of the benefits associated with recording a value indicative of the depth of the measuring point below the surface 36 of sample 20 are described. FIG. 8 shows an enlarged cross-section of sample 20 with two surface profiles: the ideal profile indicated by dashed line 64 and the typical actual profile of the beveled region indicated by the curved line 66. When samples are machined to form beveled surface 38, it is desired to have perfectly flat surfaces on either side of the interface between surface 36 and surface 38, such as that shown by dashed line 64 in FIG. 8. In practice, the machining process often produces the rounded-off corner shown by curve 66. This curvature is due to inherent limitations of the machining process itself. Notably, in the prior art, the rounded edge creates difficulty in locating the beginning of the depth profile.

Unlike the prior art SRP process using a two-probe technique such as that described previously, the present invention compensates for this curvature by affording experimenters the ability to determine the actual height in the z direction of beveled surface 38. Until fairly recently, there was little need to understand exactly what the surface characteristics were in this rounded beveled region at 66 because the depth of the implanted channels created by doping were on the order of 500+ nanometers deep. It was acceptable to estimate the position of the profile beginning within this rounded corner region. Thus, a little error in the electrical characteristics of the top tenth of the conducting region, or so, was not critical.

In present day devices, however, errors in determining resistivity in the top 10 nanometers of the conducting region cause problems. In current semiconductors, it is quite common for the implanted conductive region to be only 20 nanometers deep, unlike the earlier 100 to 400 nanometer deep regions. Mis-measuring and mis-estimating the electrical characteristics of the top 10 nanometers of the newer implanted regions can therefore be equivalent to a mis-measurement of fifty-percent (50%) of the implanted region. This is a substantial error, and as implanted regions get narrower and shallower, it is intolerable.

Several references have been made to atomic force microscopy in both the specification and claims of the present application. Examples of specific atomic force microscopes that could be used quite effectively with the method of the present invention can be found in U.S. Pat. No. RE 34,489; U.S. Pat. Nos. 5,226,801 and 5,412,980, all of which are incorporated herein by reference for all that they teach. Using these microscopes, height differences in the sub-nanometer range can be detected and thus the electrical characteristics of very precise data points of sample 20 can be measured.

Figure 9A:
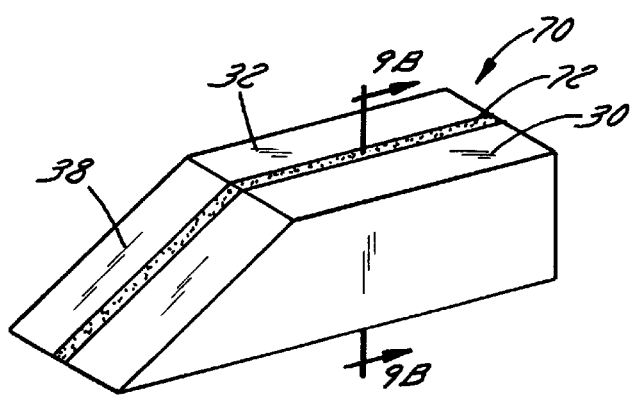
FIG. 9A is a perspective view of a sample prepared in accordance with the present invention including a painted or plated conductive region, i.e., electrode, extending generally along the center of the beveled slope and across the top surface of the sample.
Figure 9B:
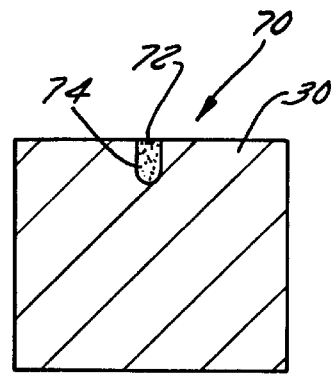
FIG. 9B is a cross-sectional view of the sample of FIG. 9A, taken along lines 9B—9B, showing the groove formed in the sample and the conductive material placed therein.

Turning to FIGS. 9A and 9B, a sample 70 prepared according to an alternative method is shown. In particular, rather than disposing the electrode on a side surface of sample 70 as shown in FIG. 5, an electrode 72 may be disposed along the top and beveled surfaces 36, 38, respectively. A groove 74 (see FIG. 8B) is preferably formed in substrate 30 in conventional fashion, and a conductive material (e.g., platinum) is thereafter used to fill groove 74, thus creating electrode 72. Generally, electrode 72 operates like electrode 40 described above, and therefore allows single probe scanning without the limitations associated with dual probe techniques.

Figure 10A:
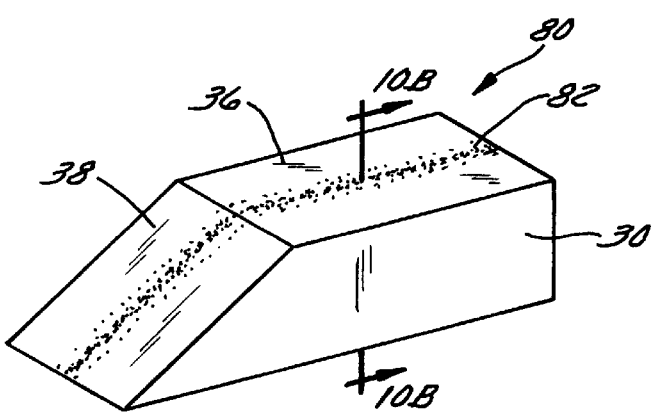
FIG. 10A is a perspective view of a sample prepared in accordance with the present invention having an extremely highly doped conductive region extending up the bevel and across the top surface of the sample.
Figure 10B:
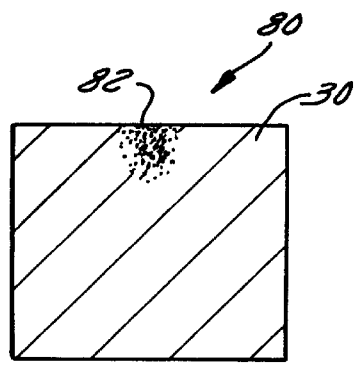
FIG. 10B is a cross-sectional view of the sample of FIG. 10A taken along lines 10B—10B, showing the highly doped conductive region.

In FIGS. 10A and 10B, a sample 80 prepared according to yet another method is shown. To prepare sample 80, rather than using a separate conductive element as in the previous embodiments, a highly localized portion 82 of substrate 30 is very heavily doped in a region generally corresponding to the groove shown in the embodiment shown in FIGS. 9A and 9B. Sample 80, similar to samples 20 and 70, can be profiled as described above in conjunction with FIG. 5. Notably, the alternative embodiments shown in FIGS. 9A, 9B and 10A, 10B, have an electrode 72, and localized dopant area 82, respectively, that are disposed on substrate 30 after the sample has been beveled. Nevertheless, operation of each of the embodiments is similar and will depend upon experimental conditions, such as the geometry of the measurement, and user requirements.

Many changes and modifications may be made to the invention without departing from the spirit thereof. The scope of some of these changes has already been discussed. The scope of other will become apparent from the attached claims.

What is claimed is:

1. A method of determining electrical characteristics of a doped semiconductor substrate comprising the steps of:

machining the top surface to provide a beveled surface that is disposed at an angle with respect to the top surface, wherein the beveled surface exposes a plurality of dopant densities at a plurality of depths within the substrate;

fixing an electrode at a first electrode location to the substrate;

moving an electrically conductive probe to a first probe location on the beveled surface; and applying a first electrical potential across the probe and electrode wherein the first electrical potential is sufficient to generate a first current through a first current carrying path defined between the first electrode location and the first probe location, wherein the first electrical potential and the first current collectively define a first electrical characteristic of the substrate along the first current carrying path.

2. The method of claim 1, further comprising recording a first value indicative of the first electrical characteristic.

3. The method of claim 2, further comprising:

moving the probe to a second probe location on the beveled surface;

applying a second electrical potential across the probe and electrode wherein the second electrical potential is sufficient to generate a second current through a second current carrying path defined between the first electrode location and the second probe location, wherein the second electrical potential and the second current collectively define a second electrical characteristic of the substrate along the first current carrying path; and recording a second value indicative of the second electrical characteristic.

4. The method of claim 3, wherein the first and second electrical potentials are the same, the first and second currents are different, and the first and second values saved are indicative of the first and second currents, respectively.

5. The method of claim 3, wherein the first and second currents are the same, the first and second electrical potentials are different, and the first and second values saved are indicative of the first and second electrical potentials, respectively.

6. The method of claim 1, wherein the probe is an atomic force microscope probe, and further comprising the steps of:

determining a first height value indicative of the height of the first location based upon the mechanical interaction of the probe with the beveled surface at the first location; and determining a second height value indicative of the height of the second location based upon the mechanical interaction of the probe with the beveled surface at the second location.

7. The method of claim 6, wherein an upper portion of the beveled surface that adjoins an unmachined portion of the top surface is rounded, and further wherein the first and second probe locations on the beveled surface are in the rounded upper portion.

8. A method of determining the electrical characteristics of a semiconductor substrate using an atomic force microscope, the substrate having a top surface doped with a first dopant material, said microscope having a piezoelectric actuator configured to selectively move a single conductive probe tip across the surface of a sample by either moving the probe with respect to the sample or by moving the sample with respect to the probe, wherein the probe tip is disposed on a free end of a cantilevered beam, and further wherein the microscope is configured to generate a signal indicative of the height of the sample, wherein the method comprises the steps of:

machining the top surface away to provide a beveled surface that is disposed at an angle with respect to the top surface, wherein the beveled surface exposes a plurality of dopant densities at a plurality of depths within the substrate;

fixing an electrode at a first electrode location to the substrate;

fixing the substrate to the sample holder of the microscope;

applying a first voltage to the piezoelectric actuator to move the probe tip and beveled surface with respect to each other until the probe tip contacts the beveled surface at a first probe location;

applying a first electrical potential across the probe tip and electrode wherein the first electrical potential is sufficient to generate a first current through a first current carrying path defined between the first electrode location and the first probe location, wherein the first electrical potential and the first current collectively define a first electrical characteristic of the substrate along the first current carrying path;

recording a first value indicative of the first electrical characteristic;

applying a second voltage to the piezoelectric actuator to move the probe tip and beveled surface with respect to each other until the probe tip contacts the beveled surface at a second probe location;

applying a second electrical potential across the probe and electrode wherein the second electrical potential is sufficient to generate a second current through a second current carrying path defined between the first electrode location and the second probe location, wherein the second electrical potential and the second current collectively define a second electrical characteristic of the substrate along the first current carrying path; and recording a second value indicative of the second electrical characteristic.

9. The method of claim 8, wherein the first and second electrical potentials are the same, the first and second currents are different, and the first and second values saved are indicative of the first and second currents, respectively.

10. The method of claim 8, wherein the first and second currents are the same, the first and second electrical potentials are different, and the first and second values saved are indicative of the first and second electrical potentials, respectively.

11. The method of claim 8, wherein the probe is an atomic force microscope probe, and further comprising the steps of:

determining a first height value indicative of the height of the first location based upon the mechanical interaction of the probe tip with the beveled surface at the first location; and determining a second height value indicative of the height of the second location based upon the mechanical interaction of the probe tip with the beveled surface at the second location.

12. The method of claim 11, wherein an upper portion of the beveled surface that adjoins an unmachined portion of the top surface is rounded, and further wherein the first and second probe locations on the beveled surface are in the rounded upper portion.

13. The method of claim 11, wherein the step of doping the semiconductor substrate includes the step of doping the semiconductor substrate to a depth of no greater than 100 nanometers.

14. The method of claim 13, wherein the step of doping the semiconductor substrate includes the step of doping the semiconductor substrate to a depth of no greater than 50 nanometers.

15. The method of claim 14, wherein the step of doping the semiconductor substrate includes the step of doping the substrate to a depth of no greater that 30 nanometers.

16. The method of claim 13, wherein the probe tip has a radius of no more than 100 nanometers.

17. The method of claim 16, wherein the probe tip has a radius of no more than 50 nanometers.

18. The method of claim 16, wherein the probe tip has a radius of no more than 30 nanometers.

19. The method of claim 16, wherein the steps of applying the first and second electrical potentials include the step of applying a probe tip force of no more than a millionth of a Newton against the beveled surface.

20. The method of claim 19, wherein a contact area between the probe tip and the beveled surface at the first and second locations is no greater that thirty square nanometers.

21. The method of claim 20, wherein the contact area between the probe tip and the beveled surface at the first and second locations is no greater than twenty square nanometers.

22. The method of claim 21, wherein the contact area between the probe tip and the beveled surface at the first and second locations is no grater than ten square nanometers.

23. The method of claim 11, wherein the step of fixing an electrode includes the step of coating a free side of the sample with a conductive metal.

24. The method of claim 23, wherein the conductive metal comprises at least one of the group consisting of aluminum, copper, silver, gold, and tungsten.

25. The method of claim 11, wherein the step of fixing an electrode includes the steps of machining a trench in the surface of the sample and filling the trench with a conductive metal.

26. The method of claim 11, wherein the step of fixing an electrode includes the step of implanting a portion of the silicon substrate with high density of conductive material, thereby creating the electrode.

27. A method of determining electrical characteristics of a doped semiconductor substrate having a top surface, the top surface being machined to provide a beveled surface that is disposed at an angle relative to the top surface, the method comprising the steps of:

fixing an electrode at a first electrode location to the substrate;

moving an electrically conductive probe to a first probe location on the beveled surface; and applying a first electrical potential across the probe and electrode wherein the first electrical potential is sufficient to generate a first current through a first current carrying path defined between the first electrode location and the first probe location, wherein the first electrical potential and the first current collectively define a first electrical characteristic of the substrate along the first current carrying path.

28. The method of claim 27, further comprising recording a first value indicative of the first electrical characteristic.

29. The method of claim 28, further comprising:

moving the probe to a second probe location on the beveled surface;

applying a second electrical potential across the probe and electrode wherein the second electrical potential is sufficient to generate a second current through a second current carrying path defined between the first electrode location and the second probe location, wherein the second electrical potential and the second current collectively define a second electrical characteristic of the substrate along the first current carrying path; and recording a second value indicative of the second electrical characteristic.

* * * * *